United States Patent [19]
Disney et al.

[11] Patent Number: 6,084,277
[45] Date of Patent: Jul. 4, 2000

[54] LATERAL POWER MOSFET WITH IMPROVED GATE DESIGN

[75] Inventors: Donald R. Disney, Cupertino; Alex B. Djenguerian, Saratoga, both of Calif.

[73] Assignee: Power Integrations, Inc., Sunnyvale, Calif.

[21] Appl. No.: 09/253,319

[22] Filed: Feb. 18, 1999

[51] Int. Cl.$^7$ ........................ H01L 31/113; H01L 31/119
[52] U.S. Cl. .......................... 257/401; 257/266; 257/413; 257/755
[58] Field of Search ..................... 257/401, 207, 257/211, 266, 270, 365, 381, 344, 409, 341, 412, 413, 755

[56] References Cited

U.S. PATENT DOCUMENTS

| | | | |
|---|---|---|---|
| 4,462,041 | 7/1984 | Glenn | 357/23 |
| 4,725,747 | 2/1988 | Stein et al. | 307/579 |
| 4,808,861 | 2/1989 | Ehni | 307/579 |
| 4,811,075 | 3/1989 | Eklund | 357/46 |
| 4,879,582 | 11/1989 | Kimura et al. | 357/23.12 |
| 4,894,694 | 1/1990 | Cham et al. | 357/23.3 |
| 4,975,758 | 12/1990 | Crafts | 357/45 |
| 5,019,877 | 5/1991 | Hosogi | 357/22 |
| 5,025,296 | 6/1991 | Fullerton et al. | 357/23.8 |
| 5,040,045 | 8/1991 | McArthur et al. | 357/53 |
| 5,060,048 | 10/1991 | Hebenstreit et al. | 357/68 |
| 5,068,700 | 11/1991 | Yamaguchi et al. | 357/23.8 |
| 5,146,306 | 9/1992 | Ferry et al. | 357/41 |
| 5,258,636 | 11/1993 | Rumennik et al. | 257/339 |
| 5,258,638 | 11/1993 | Elhatem et al. | 257/401 |
| 5,304,827 | 4/1994 | Malhi et al. | 257/262 |
| 5,430,316 | 7/1995 | Contiero et al. | 257/335 |
| 5,451,536 | 9/1995 | Redwine | 437/43 |
| 5,583,365 | 12/1996 | Villa et al. | 257/409 |
| 5,652,452 | 7/1997 | Asano | 257/341 |
| 5,744,836 | 4/1998 | Takahashi | 257/344 |
| 5,789,791 | 8/1998 | Bergemont | 257/401 |
| 5,874,764 | 2/1999 | Hsieh et al. | 257/401 |

*Primary Examiner*—Donald L. Monin, Jr.
*Attorney, Agent, or Firm*—Blakely, Sokoloff, Taylor & Zafman, LLP

[57] ABSTRACT

A lateral power metal-oxide-semiconductor field effect transistor (MOSFET) having a gate design in which the gate structure is coupled to the gate electrode through contacts at a plurality of locations. The gate electrode is disposed over the gate structure along the length of a MOSFET finger. In one embodiment, the gate electrode is coupled to the gate structure through contacts at the ends of the MOSFET finger such that there is a contact-free portion of the gate region between the contacts.

54 Claims, 10 Drawing Sheets

LATERAL POWER MOSFET WITH IMPROVED GATE DESIGN

BACKGROUND OF THE INVENTION

1. Field of the Invention

The present invention relates generally to semiconductor devices and, more specifically, the present invention relates to a high voltage field effect transistor with an improved gate design.

2. Background Information

A common type of integrated circuit device is a metal-oxide-semiconductor field effect transistor (MOSFET). A MOSFET is a field effect device that includes a source region, a drain region, a channel region extending between the source and drain regions, and a gate provided over the channel region. The gate includes a conductive gate structure disposed over and separated from the channel region with a thin oxide layer.

Figure 1A:
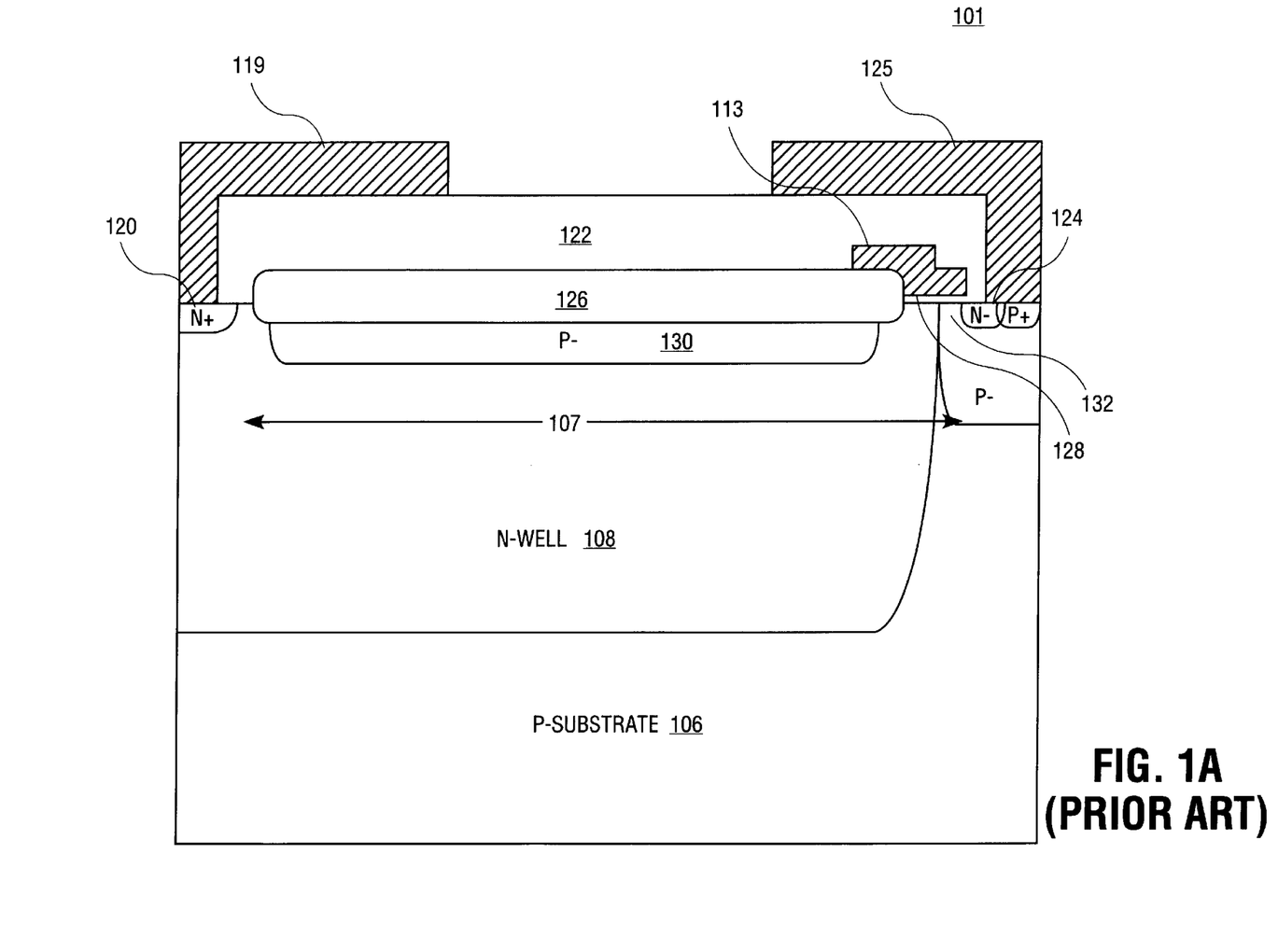
FIG. 1A is a cross section illustration of a prior art high voltage field effect transistor.

For high voltage applications, such as for example applications greater than 200 volts, lateral power transistors are often used. A cross-section from one such device 101 is shown in FIG. 1A. Device 101 is a field effect device including a drain region 120 and a source region 124 separated by an intermediate region 107. A gate structure 113 is disposed over a thin oxide layer 128 over the metal-oxide-semiconductor (MOS) channel 132 of device 101. In device 101, the MOS channel 132 under gate structure 113 is included in intermediate region 107.

In the on state, a voltage is applied to a gate structure 113 to cause the MOS channel 132 to form between an N+ source region 124 and an N well region 108, allowing current to flow from N+ drain region 120, through N well 108, through the MOS channel 132, into the N+ source region 124. In the off state, the voltage on gate structure 113 is reduced such that the MOS channel 132 is removed, thereby interrupting the current flow path. In this condition, high voltage is supported between drain region 120 and source region 124 via mutual depletion of N well 108 and substrate 106. In the device 101 shown in FIG. 1A, a P-region 130 is also included along the surface of N well 108 to assist depletion of N well 108.

To help prevent or control high electric fields from developing at either end of device 101, which would degrade the breakdown voltage, it is common to form field plates over the source and drain regions. In device 101, a drain field plate is formed with a drain electrode finger 119 extending over interlevel dielectric 122 to form a one-tiered drain field plate. A three-tiered source field plate is formed by gate structure 113 over thin gate oxide 128, gate structure 113 over field oxide 126 and source electrode finger 125 over interlevel dielectric 122. Therefore, gate structure 113 serves two roles: controlling the flow of current (switching device 101 on and off) and acting as a portion of the source field plate.

Figure 1B:
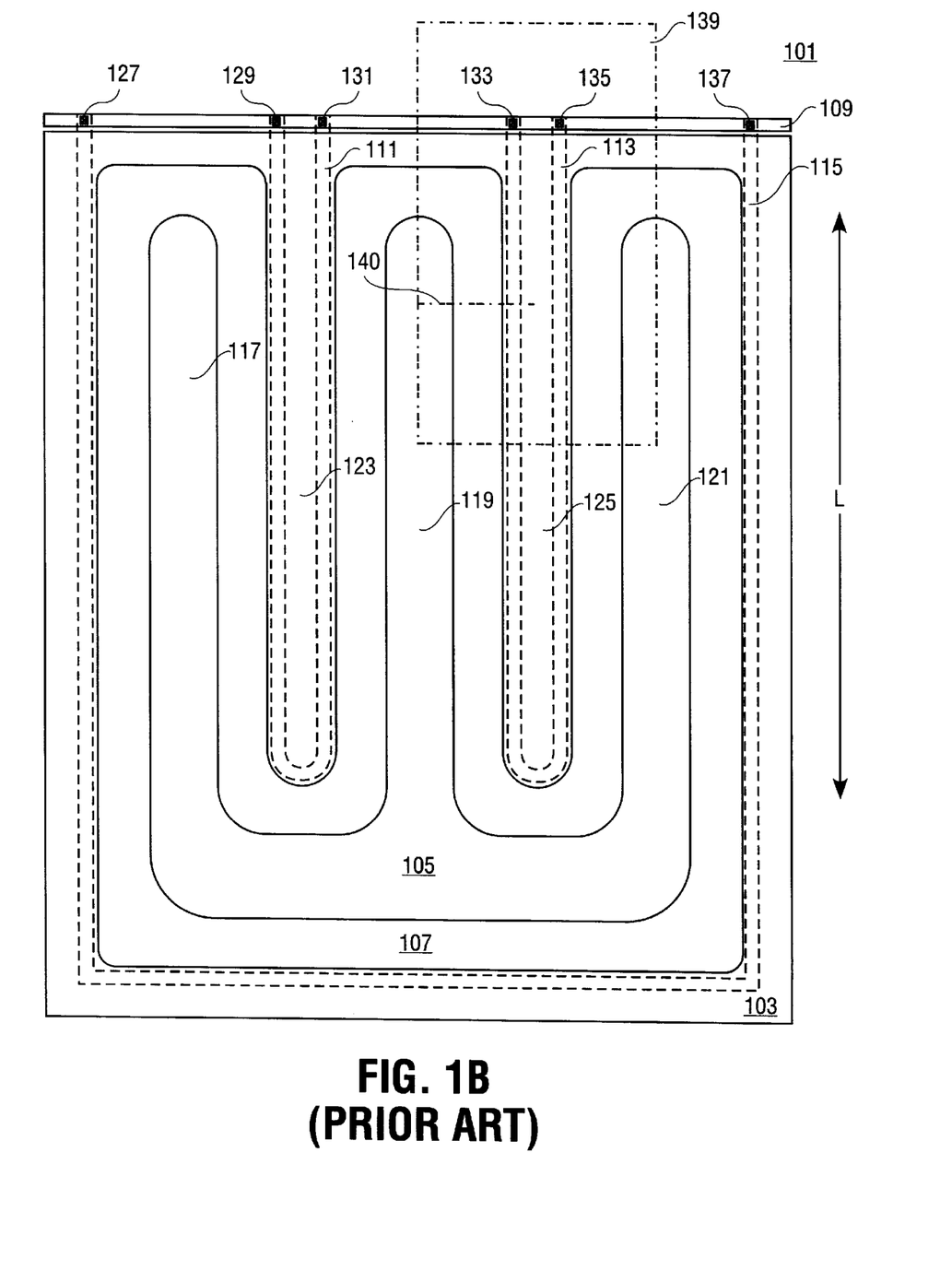
FIG. 1B is an illustration of a layout of a prior art high voltage field effect transistor having interdigitated source and drain finger regions and a gate structure coupled to a gate electrode at one end of the field effect transistor.

Lateral power transistors are commonly designed in an interdigitated arrangement. To illustrate, FIG. 1B is a layout diagram of prior art device 101, which has interdigitated source and drain regions. The cross section illustration of FIG. 1A corresponds to dashed line 140 illustrated in FIG. 1B. Device 101 includes a drain electrode 105, source electrode 103 and gate electrode 109. Drain electrode 105 includes drain electrode fingers 117, 119 and 121. Source electrode 103 includes source electrode fingers 123 and 125. Drain electrode 105 is coupled to a doped drain region below (shown as drain region 120 in FIG. 1A) in the semiconductor substrate and source electrode 103 is coupled to a doped source region below (shown as source region 124 in FIG. 1A) in the semiconductor substrate. Intermediate region 107 extends between the drain and source regions of drain and source electrodes 105 and 103, respectively. Intermediate region 107 includes the channel region or MOS channel region 132 and extends beneath gate structures 111, 113 and 115.

As shown in FIG. 1B, the layout of device 101 includes alternating fingers of the drain and source electrodes 105 and 103. To increase device efficiency and reduce the inactive area associated with the ends of the fingers of drain and source electrodes 105 and 103, the fingers are generally made as long as possible, within the confines of the desired size of the integrated circuit. To achieve this end, the length L is generally increased.

Gate electrode 109 is coupled to gate structures 111, 113 and 115 through metal contacts 127, 129, 131, 133, 135 and 137. As shown in FIG. 1B, gate structures 111, 113 and 115 are disposed beneath source electrode 103 and are also disposed over a portion of intermediate region 107. A thin gate oxide layer exists under gate structures 111, 113 and 115. Gate structures 111, 113 and 115 control the flow of current between the source and drain regions. In MOS lateral power transistors such as device 101, gate structures 111, 113 and 115 are disposed in close proximity to source electrode 103 including fingers 123 and 125.

In order to provide high breakdown voltage, it is desirable to maintain the relative positions of the gate structure, the source electrode, the intermediate region and the drain electrode. In particular, the gate structure and the electrodes should not protrude into the intermediate region at any point along the length of the device. Moreover, it is desirable to maintain rounded geometries at the end of the fingertips in order to help prevent or control high electric fields in these areas. These features of high voltage devices preclude the use of techniques sometimes used in low voltage complementary metal oxide semiconductor (CMOS) devices, such as the extension of the gate structure on either end of the fingertips to allow contact to a gate electrode.

Gate structures 111, 113 and 115 are usually made of polysilicon layers having sheet resistances of about 20–60 ohms/square. The thin gate oxide layers under the gate structures and above the channel region 132 of intermediate region 107 are usually relatively thin (e.g. <1000 Angstroms) and cover some portion of the underlying source and drain doped regions. Since fingers 117, 119, 121, 123 and 125 can be relatively long (e.g. 2–8 mm) the total gate resistance as well as the gate-source and gate-drain capacitance can be significant. When the gate of device 101 is switched on and off, this large capacitance must be charged and discharged through the gate resistance, leading to a resistor-capacitor (RC) delay in the switching characteristics of device 101.

As shown in FIG. 1B, gate electrode 109 is located on one end of device 101. Gate structures 111, 113 and 115 distribute a gate signal received from gate electrode 109 along the length of each finger. For example, gate structure 111 distributes the gate signal along the length of source finger 123. Gate structure 113 distributes the gate signal along the length of source finger 125. Gate structure 115 distributes the gate signal along the lengths of other fingers along the sides of source electrode 103.

The presence of the above mentioned RC delay can be beneficial as the delay can slow the voltage transients in the device and therefore reduce switching noise. The switching noise includes harmonics associated with very fast changes in voltage and/or current. In addition, since gate electrode 109 does not run along the length of the source fingers, the source electrode 103 can be wider and this can conduct more current.

Figure 2:
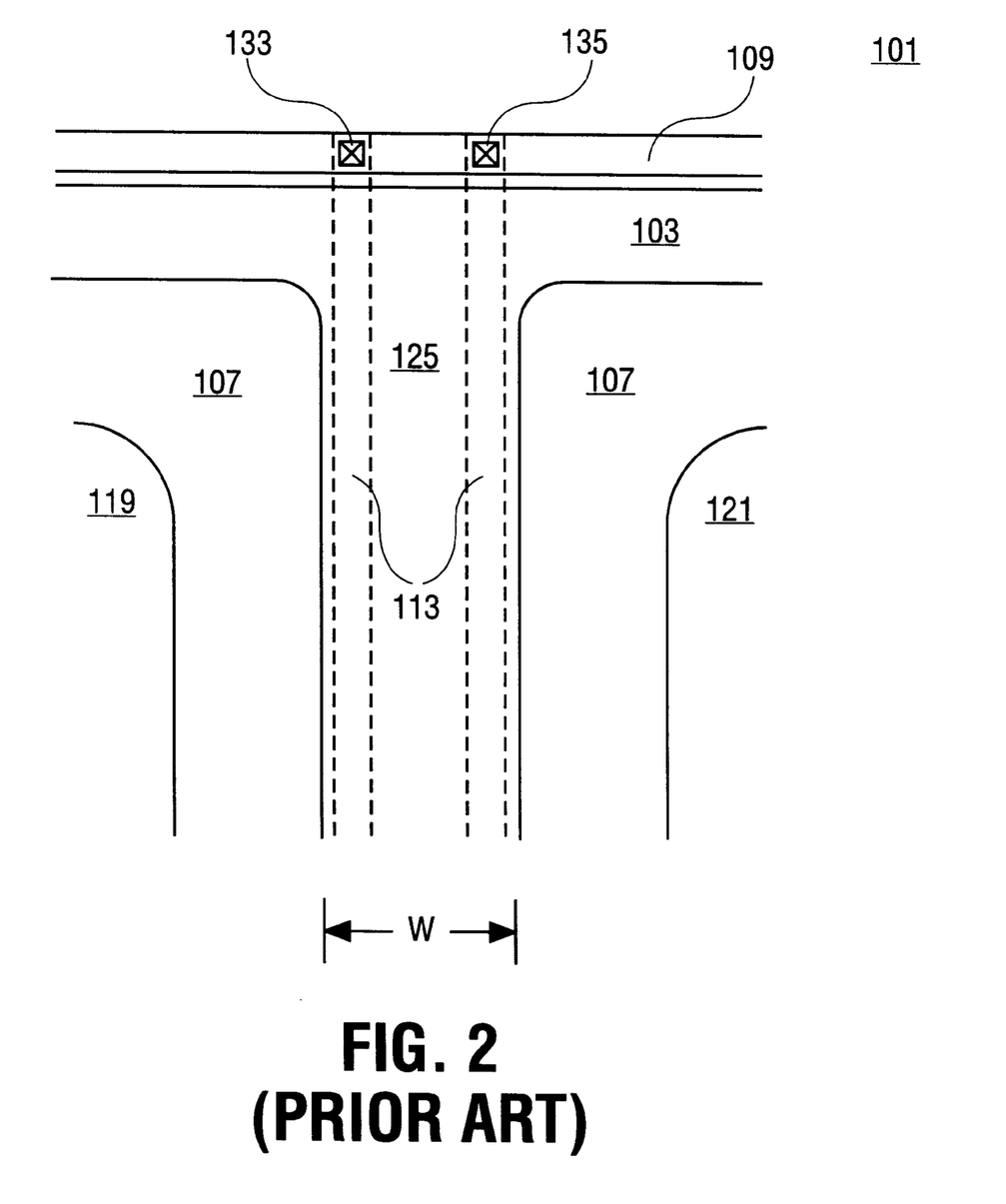
FIG. 2 is an illustration showing greater detail of a portion of the gate structure associated with a source finger region of the prior art field effect transistor.

To illustrate, FIG. 2 is an enlarged view of region 139 of device 101 of FIG. 1. Source electrode 103 includes source electrode finger 125. Intermediate region 107 extends between the source and drain regions of source electrode finger 125 and drain electrode fingers 119 and 121. Intermediate region 107 includes a channel region that extends beneath gate structure 113. Gate structure 113 is disposed beneath source finger 125 and is coupled to gate electrode 109 through contacts 133 and 135. As shown in FIG. 2, gate electrode 109 is located at an end of device 101. Since gate electrode 109 does not run along the sides of source electrode finger 125, the width W of source electrode finger 125 can be wider and conduct more current.

A disadvantage of device 101 as illustrated in FIGS. 1–2 is that the turn-on and turn-off of device 101 can be non-uniform along the lengths of the fingers. In particular, the portion of device 101 that is at the end of a finger closest to the contact of gate electrode 109 turns off more quickly than the end of the finger that is farthest from the contact. Because the drain voltage rises relatively quickly during the turn-off, the end of the finger figure that is farthest from the contact is exposed to high voltage and high current simultaneously. This non-uniform switching results in a degradation of the safe-operating area (SOA) of device 101 and consequently limits the length L of the fingers.

Figure 4:
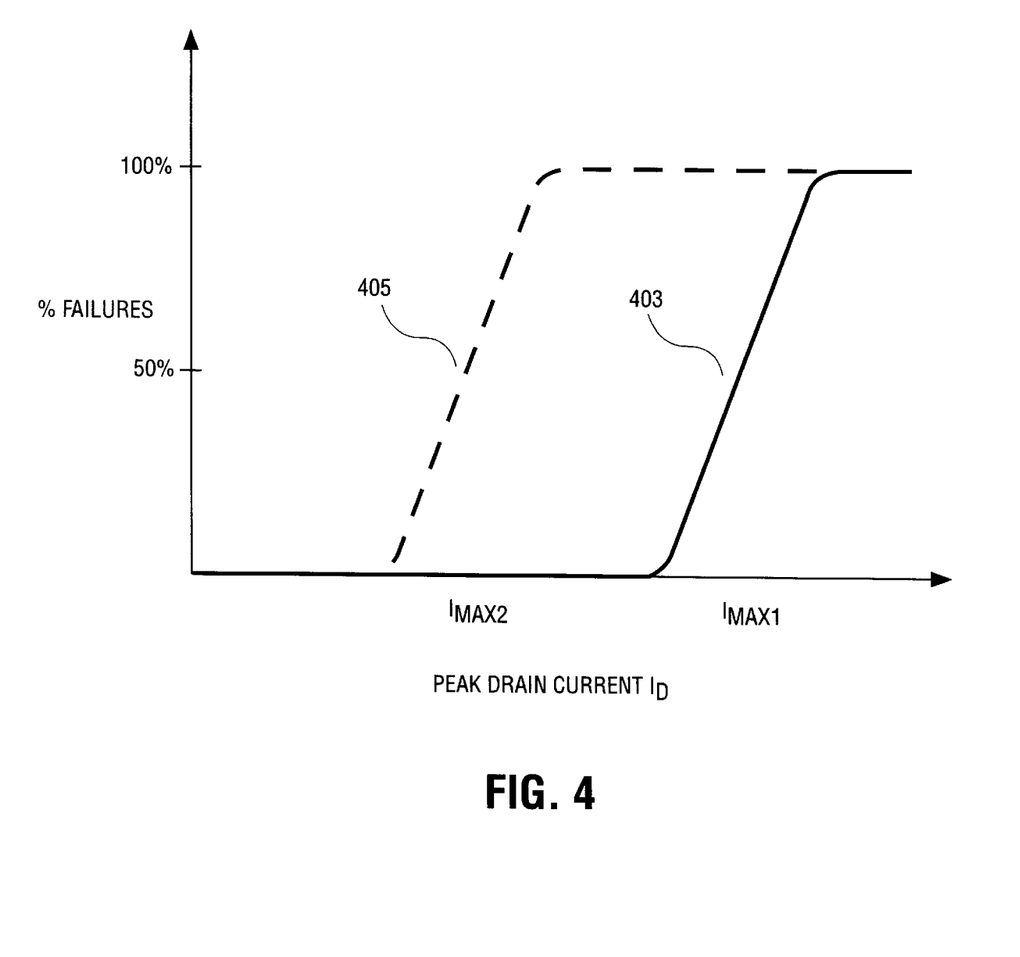
FIG. 4 is an illustration showing safe operating areas of various field effect transistors.

To illustrate the SOA of device 101, FIG. 4 is a diagram of the percentage of devices that fail when subjected to a given peak drain current $I_D$ in a given inductive switching application such as for example an AC-DC power converter circuit. Plot 403 shows that the percentage of failures for device 101 with a shorter length L and plot 405 shows the percentage of failures for device 101 with a longer length L. Plot 403 shows that the maximum current $I_{MAX1}$, which is defined as the peak drain current $I_D$ causing 50% failure rate, for device 101 having the shorter length L is greater than the maximum current $I_{MAX2}$ for device 101 having a longer length. Hence, if the length of device 101 is increased, the maximum drain current $I_D$ (and SOA) is sacrificed as a consequence of the non-uniform switching discussed above.

Figure 3:
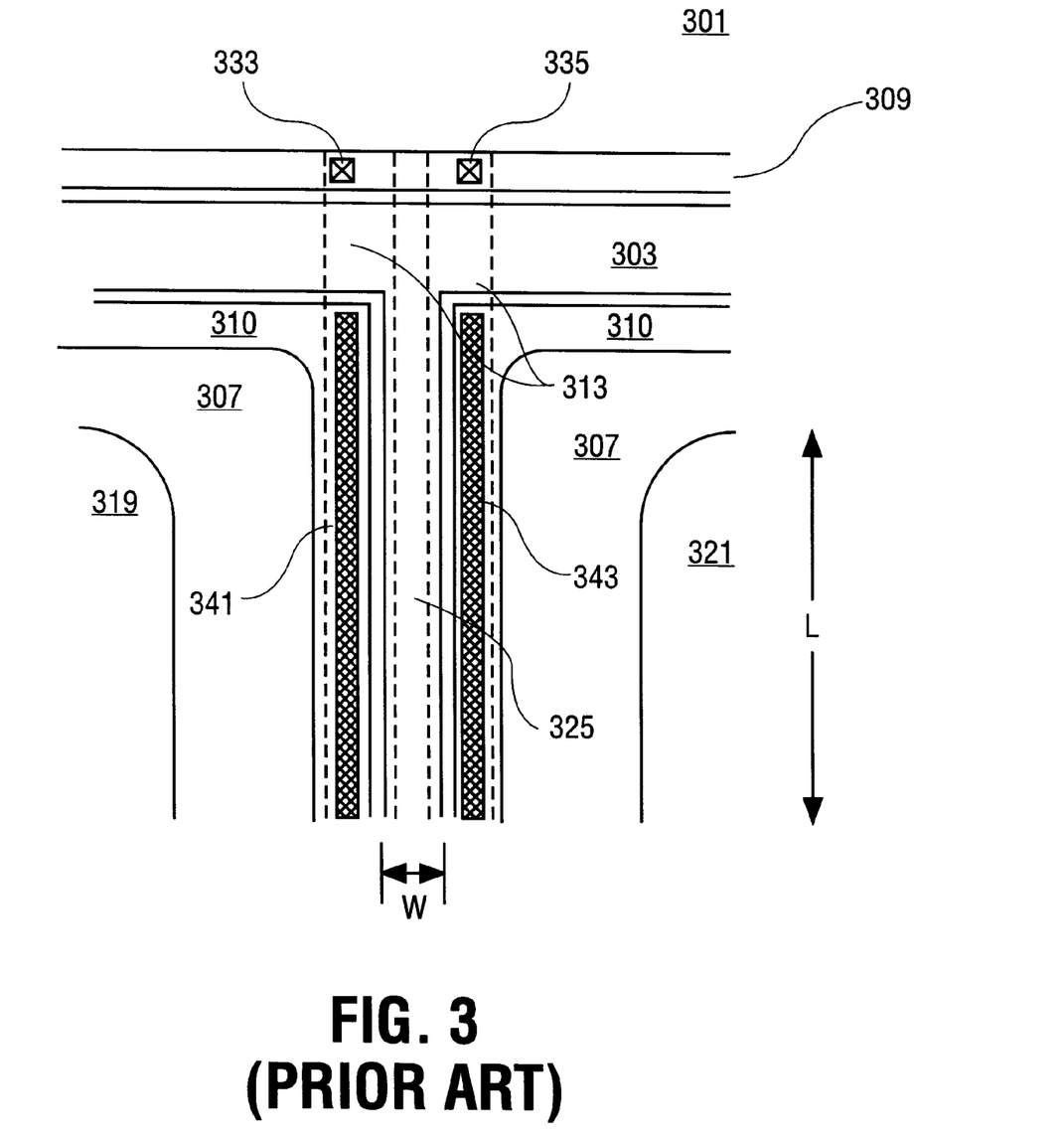
FIG. 3 is an illustration showing another prior art field effect transistor having a gate electrode making continuous contact with the gate structure along the length of a source finger region.

FIG. 3 is an illustration of a prior art device 301 that addresses the above-discussed problem of non-uniform switching. Device 301 reduces the RC delay discussed above to provide more uniform switching. In particular, FIG. 3 shows that gate electrode 309 is located at the end of device 301, and a second gate electrode 310 is also run in parallel along the sides of source electrode finger 325 of source electrode 303 to supply the gate signal to the gate structure 313 along the length of the finger. Intermediate region 307 separates the source and drain regions of source electrode 303 from drain electrode fingers 319 and 321. Intermediate region 307 includes a channel that extends beneath gate structure 313. Gate structure 313 is disposed beneath gate electrodes 309 and 310 and source electrode 303. Gate electrode 309 is coupled to gate structure 313 through contacts 333 and 335. Gate electrode 310 is coupled to gate structure 313 through contacts 341 and 343.

As shown in FIG. 3, contacts 341 and 343 are continuous along the sides of source electrode finger 325 and therefore make continuous contact between gate electrode 310 and gate structure 313 for the length of source electrode finger 325. As a result, the gate resistance of device 301 is much less than the gate resistance of device 101 since gate electrode 310 generally has a much lower sheet resistance than gate structure 313. For example, gate electrode 310 is usually made of metal having a sheet resistance of less than approximately 0.05 ohms/square. In comparison, gate structure 313 is usually made of polysilicon having a sheet resistance of approximately 20–60 ohms/square. With the lowered gate resistance, the RC delay discussed above is reduced accordingly. This results in device 301 switching on and off uniformly, which makes the SOA of device 301 independent of finger length.

A disadvantage with device 301 is that the reduction in the RC delay may be too great such that excessive switching noise may be produced by rapid voltage transients. Another disadvantage with the addition of continuous contacts 341 and 343 is that with gate electrode 310 running in parallel along the sides of source electrode finger 325, the width W of source finger 325 is reduced in comparison with device 101 of FIGS. 1–2. The maximum amount of current that source electrode finger 325 can handle is limited by electromigration and other concerns, and is approximately proportional to W. Consequently, the maximum amount of current that device 301 can handle is lower than device 101.

Thus, what is desired is a field effect device that can be designed with increased length, increased maximum current, and improved SOA.

SUMMARY OF THE INVENTION

A field effect device having an improved gate design is disclosed. In one embodiment, the field effect device includes a source region, a drain region and a channel region located between the source region and the drain region. A gate structure is disposed over the channel region. The gate structure includes a first contact region and a second contact region separated by a contact-free region. A gate electrode is coupled to the gate structure through first and second contacts. The first contact is coupled to the gate structure in the first region and the second contact is coupled to the gate structure in the second region. A field plate including the gate structure is disposed over the channel region and is extended toward the drain region. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

DETAILED DESCRIPTION

A lateral power MOSFET or transistor having an improved gate design is disclosed. The subject of the present invention will be described with reference to numerous details set forth below. The accompanying drawings will illustrate the invention. The following description and drawings are illustrative of the invention and are not to be construed as limiting the invention. Numerous specific details are described to provide a thorough understanding of the present invention. In certain instances, however, well-known or conventional details are not described in order not to obscure the present invention.

One embodiment of field effect device or transistor of the present invention provides a large SOA and high current capability with moderate gate speed to suppress switching noise. This is accomplished in one embodiment of the present invention by providing a metal gate electrode in parallel with the polysilicon gate structure along the length of the power MOSFET finger. The metal and polysilicon of the gate electrode and structure, respectively, are connected using metal contacts that are spaced apart along the gate structure such that there is a resistance between the metal contacts through the gate structure due to the sheet resistance of the polysilicon. In one embodiment, the contacts are located at each end of a finger in the power MOSFET. In another embodiment, there are contacts located at each end of the finger of the power MOSFET and there are contacts located in between the ends of the finger of the power MOSFET.

With the contacts located at multiple locations between the gate electrode and gate structure along the power MOSFET finger, more uniform switching is provided. Furthermore, since there is resistance between the contacts in the gate structure along the power MOSFET finger, an RC delay is provided to reduce switching noise. In addition, the layout of the gate electrode in relation to the power MOSFET finger regions according to one embodiment of the present invention enable the power MOSFET electrode fingers to be wider, thereby providing greater maximum current capacity.

Figure 5A:
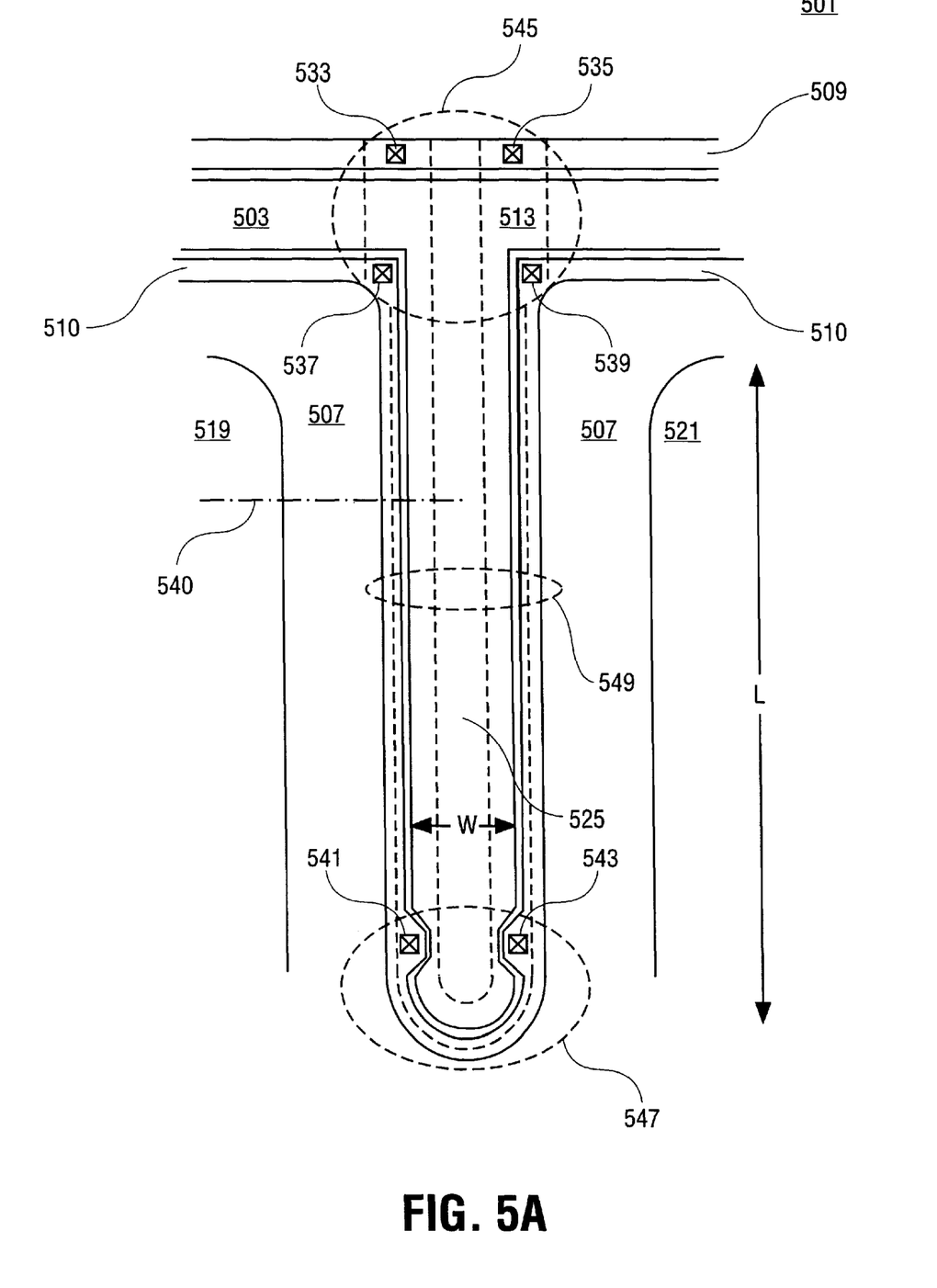
FIG. 5A is an illustration of a layout of one embodiment of a gate electrode and gate structure in relation to a finger of a field effect transistor in accordance with the teachings of the present invention.

FIG. 5A is an illustration showing the layout of one embodiment of a portion of a device 501 in accordance with the teachings of one embodiment of the present invention. Device 501 includes a source region with source electrode 503 including source electrode finger 525. Device 501 also includes a drain region including drain electrode fingers 519 and 521. Source electrode 503 and source electrode finger 525 are coupled to a doped source region below in the semiconductor substrate through contacts (not shown). Drain electrode fingers 519 and 521 are coupled to doped drain regions in the semiconductor substrate below through contacts (not shown). An intermediate region 507 extends between the source region and the drain region. In one embodiment, intermediate region 507 includes a channel region or MOS region that extends beneath gate structure 513 to control the flow of current between the source and drain regions. In one embodiment, device 501 is a lateral power MOSFET and the fingers of device 501 are interdigitated as shown. In one embodiment, the power MOSFET of device 501 has a MOSFET breakdown voltage of greater than 200 volts. In one embodiment, intermediate region 507 also includes a lightly doped drain region, an extended drain region or the like.

In the embodiment illustrated in FIG. 5A, it is noted that electrode finger 525 is described for explanation purposes as being in a source region and that electrode fingers 519 and 521 are described as being in drain regions. In another embodiment, it is appreciated that electrode finger 525 may be part of a drain region and that electrode fingers 519 and 521 are part of source regions in accordance with the teachings of the present invention.

Device 501 also includes a gate electrode 509, which in one embodiment is located at one end of device 501. A second gate electrode 510 is run in parallel along the sides of source electrode finger 525. As shown in FIG. 5A, portions of a gate structure 513 are disposed over the channel region of intermediate region 507 as well as beneath gate electrodes 509 and 510 and beneath source electrode 503 and source electrode finger 525. In one embodiment, gate structure 513 includes polysilicon, silicide or the like. A thin gate oxide layer is disposed between gate structure 513 and the channel region of intermediate region 507.

Figure 5B:
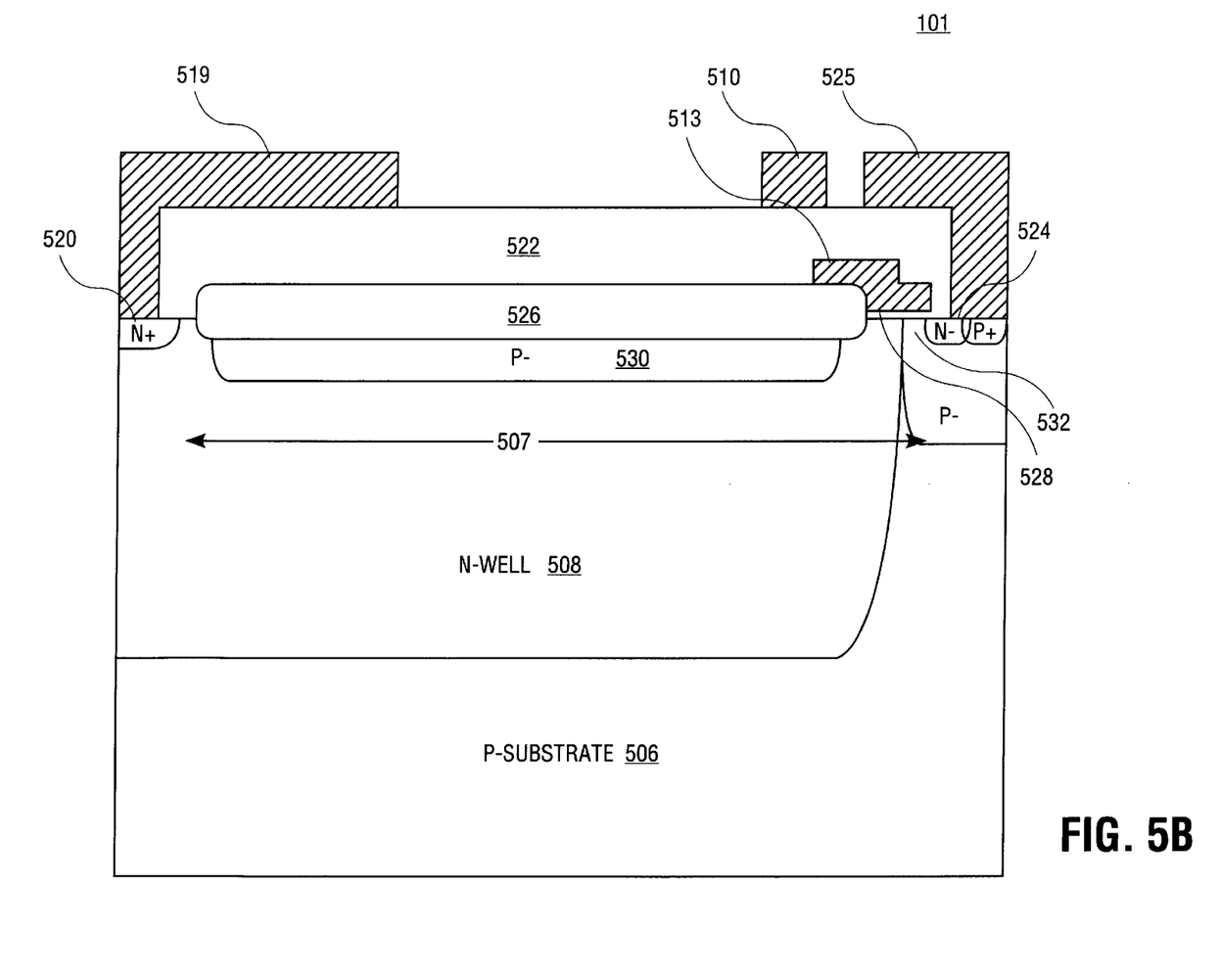
FIG. 5B is a cross section illustration of one embodiment of a field effect transistor in accordance with the teachings of the present invention.

To illustrate, FIG. 5B is a cross section illustration of device 501 along dashed line 540. As shown in FIG. 5B, device 501 includes a drain region 520 and a source region 524 separated by intermediate region 507. Gate structure 513 is disposed over thin oxide layer 528 over the MOS channel 532 of device 501. In one embodiment, thin oxide layer 528 is made of an insulating material. In device 501, the MOS channel 532 under gate structure 513 is included in intermediate region 507. As shown in FIG. 5B, drain electrode finger 519 is coupled to drain region 520 through interlevel dielectric 522 and source electrode finger 525 is coupled to source region 524 through interlevel dielectric 522. In one embodiment, interlevel dielectric 522 is made of an insulating material.

In the on state, a voltage is applied to a gate structure 513 to cause the MOS channel 532 to form between an N+ source region 524 and an N well region 508, allowing current to flow from N+ drain region 520, through N well 508, through the MOS channel 532, into the N+ source region 524. In the off state, the voltage on gate structure 513 is reduced such that the MOS channel 532 is removed, thereby interrupting the current flow path. In this condition, high voltage is supported between drain region 520 and source region 524 via mutual depletion of N well 508 and substrate 506. In one embodiment, a P-region 530 is also included along the surface of N well 508 to assist depletion of N well 508. In another embodiment, P-region 530 is not included along the surface of N well 508 to assist depletion of N well 508. In one embodiment, N well 508 includes an extended drain region located between drain region 520 and channel region 532.

To help prevent or control high electric fields from developing at either end of device 501, which would degrade the breakdown voltage, one embodiment of device 501 includes field plates. In the embodiment illustrated in FIG. 5B, a drain field plate is formed with a drain electrode finger 519 extending over interlevel dielectric 522 to form a one-tiered drain field plate.

As shown in the cross section illustration of FIG. 5B, gate electrode 510 is disposed over interlevel dielectric 522 in close proximity to gate structure 513. In one embodiment, a portion of gate electrode 510 is disposed over gate structure 513 and at least a portion of gate electrode 510 is disposed between drain electrode 519 and gate structure 515. In another embodiment, the entire gate electrode 510 is disposed over gate structure 513. In still another embodiment, the entire gate electrode 510 is disposed between drain electrode 519 and gate structure 513. By extending gate electrode 510 over interlevel dielectric 522 toward drain electrode finger 519 and away from source electrode finger 525, additional room is provided for the width of source electrode finger 525. In addition, a three-tiered source field plate is formed by gate structure 513 over thin gate oxide 528, gate structure 513 over field oxide 526 and gate electrode 510 over interlevel dielectric 522. Therefore, gate electrode 510 and gate structure 513 serve two roles: controlling the flow of current (switching device 501 on and off) and acting as a portion of the source field plate. In one embodiment, field oxide 526 is thicker than thin gate oxide 528 and is made of an insulating material.

Referring back to FIG. 5A, gate structure 513 includes a first contact region 545 and a second contact region 547 in one embodiment. First contact region 545 is located at one end of source electrode finger 525 and the second contact region 547 is located at the other end of source electrode finger 525. In one embodiment, first contact region 545 of gate structure 513 is separated from second contact region 547 by a contact-free region in gate structure 513. In one embodiment, first and second contact regions 545 and 547 are less than approximately 100 microns in length along source electrode finger 525. In one embodiment, the fingers of device 501, such as for example source electrode finger 525, have a length of approximately 2–8 mm. Thus, the lengths of first and second contact regions 545 and 547 are substantially less than the length of the fingers of device 501. It is appreciated of course that these specific lengths are provided for explanation purposes only in that other lengths may be utilized in accordance with the teachings of the present invention.

As shown in FIG. 5A, gate electrode 509 is coupled to gate structure 513 through contacts 533 and 535. Gate electrode 510 is coupled to gate structure 513 through contacts 537 and 539 in first contact region 545. Gate electrode 510 is also coupled to gate structure 513 through contacts 541 and 543 in second contact region 547. In the embodiment illustrated in FIG. 5A, there are no contacts between gate structure 513 and gate electrode 510 in the contact-free region between first contact region 545 and second contact region 547. In one embodiment, each contact 533, 535, 537, 539, 541 and 543 may be a single contact or an array of contacts in close proximity.

In one embodiment, a gate signal carried by gate electrode 509 is received by gate structure 513 at one end of source electrode finger 525 through contacts 533 and 535. Gate electrode 510 receives the gate signal through contacts 537 and 539 and provides the gate signal to gate structure 513 at the other end of source electrode finger 525 through contacts 541 and 543. As a result, current flowing through the channel region 532 of intermediate region 507 between source electrode 503/source electrode finger 525 and drain electrode fingers 519 and 521 is switched in response to the gate signal. Due to the sheet resistance of gate structure 513, there is a distributed resistance between gate electrode 510 and the contact-free region of gate structure 513 between first contact region 545 and second contact region 547. In one embodiment, gate structure 513 comprises polysilicon and has a sheet resistance of approximately 20–60 ohms/square. In one embodiment, gate electrodes 509 and 510 and contacts 533, 535, 537, 539, 541 and 543 comprise metal and have a substantially lower sheet resistance of approximately 0.02 ohms/square. It is appreciated, of course that other sheet resistances for gate structure 513, gate electrodes 509 and 510 and contacts 533, 535, 537, 539, 541 and 543 may be utilized in accordance with the teachings of the present invention.

In the embodiment illustrated in FIG. 5A, the gate signal is received by gate structure 513 from gate electrode 509 through contacts 533 and 535 and is distributed to multiple locations in gate structure 513 by gate electrode 510 and contacts 537, 539, 541 and 543. As a result, the switching or turn-on and turn-off of device 501 is more uniform along the length of source electrode finger 525 in comparison with the turn on and turn off of prior art device 101.

Figure 6:
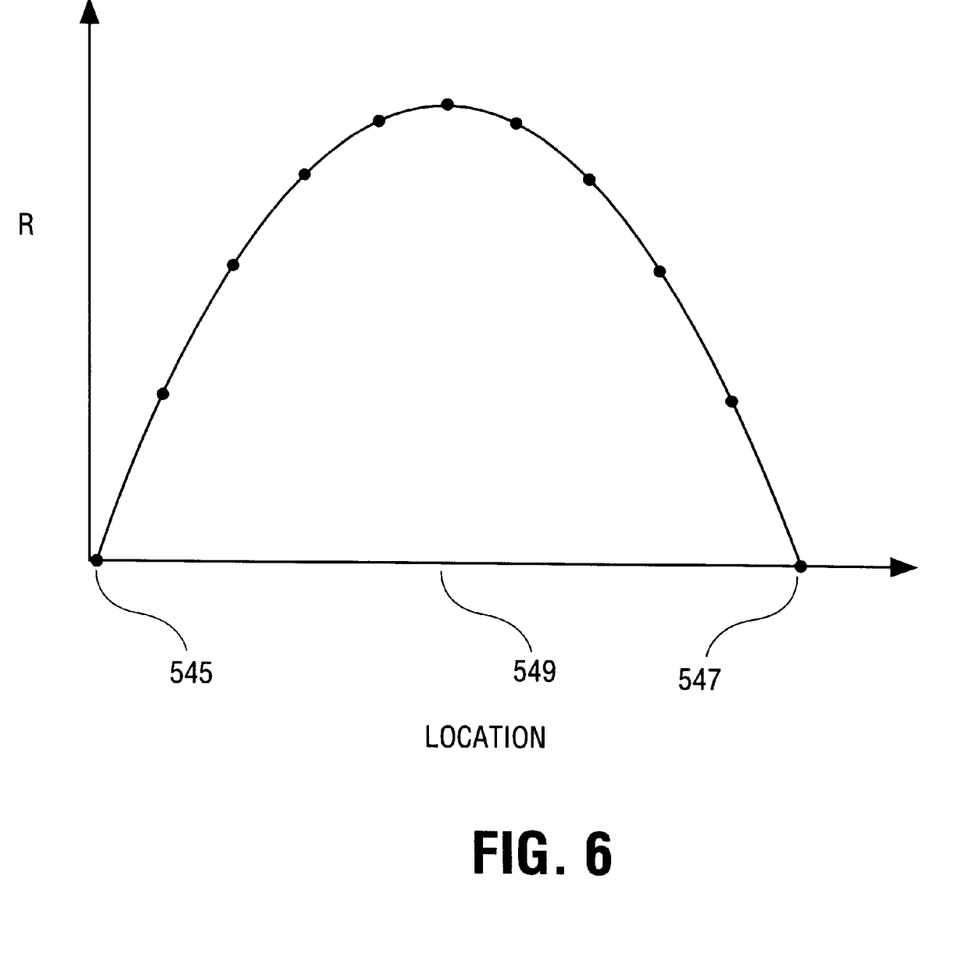
FIG. 6 is an illustration showing the resistance between the gate structure and gate electrode from various locations of the gate structure along the finger of one embodiment of the present invention.

Due to the distributed resistance in the gate structure 513 between the first contact region 545 and second contact region 547, there is an RC delay in the switching of device 501. This RC delay slows the voltage transients, which reduces switching noise in device 501. FIG. 6 is an illustration showing the resistance R to gate electrode 510 from various locations within gate structure 513. As shown in FIG. 6, the resistance R to gate electrode 510 from the location of first contact region 545 in gate structure 513 is substantially zero. This is because gate structure 513 is coupled to gate electrode 509 through contacts 537 and 539 at this location. Similarly, the resistance R between gate structure 513 and gate electrode 510 is also substantially zero at the location of second contact region 547 since this is where contacts 541 and 543 couple gate electrode 510 to gate structure 513.

In the locations of the contact-free region between first contact region 545 and second contact region 547, the resistance R between gate structure 513 and gate electrode 510 is substantially greater due to the sheet resistance of gate structure 513. As shown in FIG. 6, the resistance R is maximum at a location 549, which in one embodiment is midway between first contact region 545 and second contact region 547. It is appreciated that the effective resistance R between the gate electrode 510 and locations in the contact-free regions of gate structure 513 is equivalent to two resistors coupled in parallel between gate structure 513 and gate electrode 510. This effective resistance R approaches zero as the location in gate structure 513 approaches either one of the first or second contact regions 545 or 547.

In the embodiment illustrated in FIG. 5A, it is also noted that since gate electrode 510 is only coupled to gate structure 513 in first and second contact regions 545 and 547, the width W of the source electrode finger 525 is greater in comparison to the width W of the source electrode finger 325 of prior art device 301. That is, source electrode finger may be wider in areas proximate to the contact-free region between first contact region 545 and second contact region 547. This is because access to gate structure 513 by gate electrode 509 is not required in the contact-free region. As a result, a wider source electrode finger 525 has a greater capacity to carry more current. Therefore, the length L of device 501 can be increased to increase the length of the source and drain electrode fingers to increase the active to inactive area ratio of device 501. Thus, the wider source electrode finger 525 enables the efficiency of device 501 to be increased by increasing the length L of device 501.

Referring briefly back to FIG. 4, it is noted that one embodiment of device 501 exhibits an SOA similar to plot 403. That is, device 501 has a higher and therefore more desirable maximum drain current $I_D$ of $I_{MAX1}$, even with drain and source fingers that are increased in length to increase the efficiency of device 501.

Figure 7:
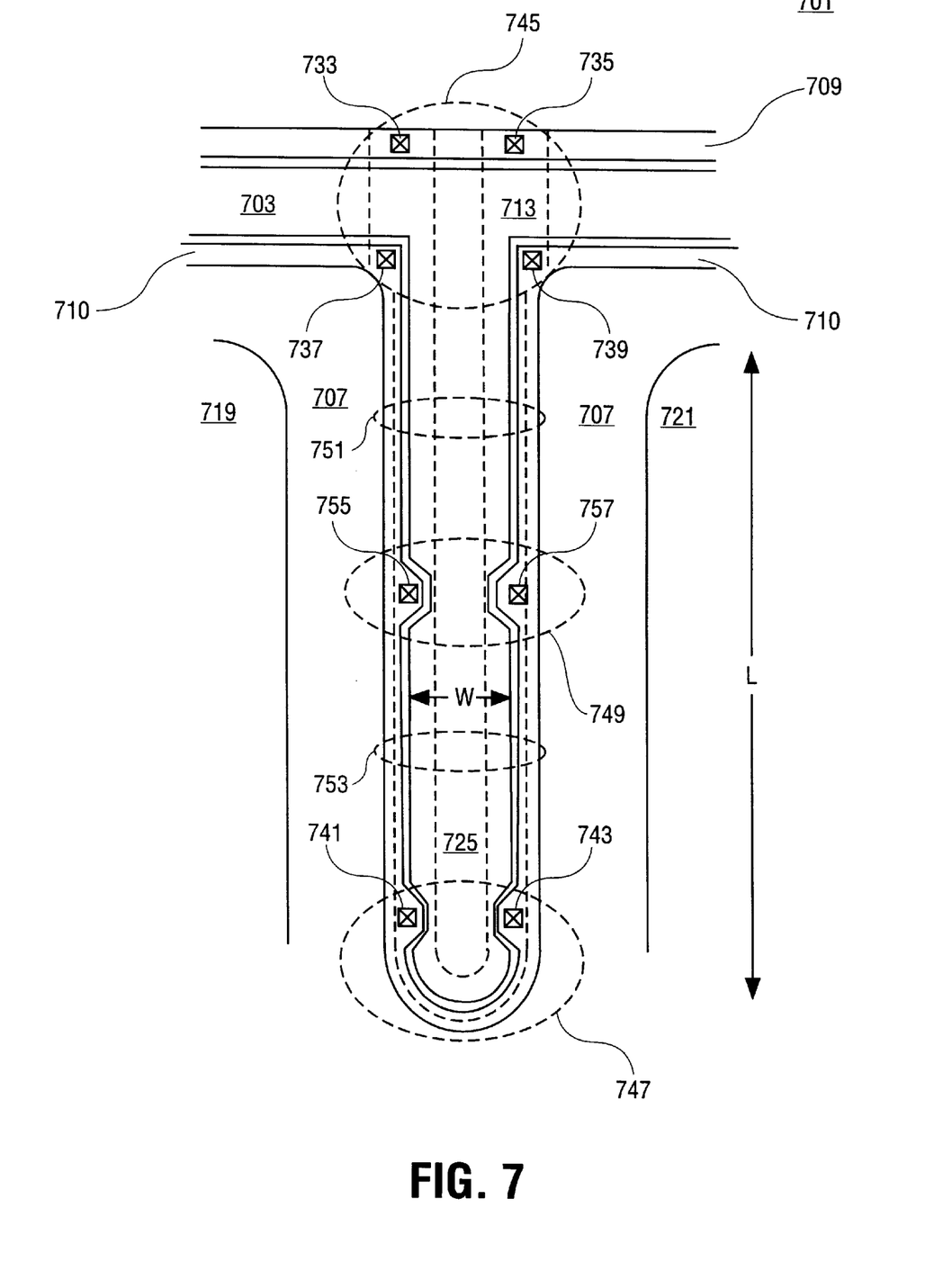
FIG. 7 is an illustration of a layout of another embodiment of a gate electrode and gate structure in relation to a source finger of a field effect transistor in accordance with the teachings of the present invention.

FIG. 7 is an illustration showing the layout of another embodiment of a portion of a device 701 in accordance with the teachings of the present invention. Device 701 includes a source region with source electrode 703 including source electrode finger 725. Device 701 also includes a drain region including drain electrode fingers 719 and 721. Source electrode 703 and source electrode finger 725 are coupled to a doped source region below in the semiconductor substrate through contacts (not shown). Drain electrode fingers 719 and 721 are coupled to doped drain regions below in the semiconductor substrate through contacts (not shown). An intermediate region 707 extends between the source region and the drain region. In one embodiment, intermediate region 707 includes a channel region or MOS region that extends beneath gate structure 713 to control the flow of current between the source and drain regions. In one embodiment, device 701 is a lateral power MOSFET and the fingers of device 701 are interdigitated as shown. In one embodiment, the power MOSFET of device 701 has a MOSFET breakdown voltage of greater than 200 volts. In one embodiment, intermediate region 707 also includes a lightly doped drain region, an extended drain region or the like.

Device 701 also includes a gate electrode 709, which in one embodiment is located at one end of device 701. A second gate electrode 710 is run in parallel along the sides of source electrode finger 725. As shown in FIG. 7, portions of a gate structure 713 are disposed over the channel region of intermediate region 707 as well as beneath gate electrodes 709 and 710 and beneath source electrode 703 and source electrode finger 725. A thin gate oxide layer (not shown) is disposed between gate structure 713 and the channel region of intermediate region 707.

In one embodiment, gate structure 713 includes a first contact region 745, a second contact region 747 and an intermediate contact region 749. First contact region 745 is located at one end of source electrode finger 725 and the second contact region 747 is located at the other end of source electrode finger 725. Intermediate contact region 749 is located between first and second contact regions 745 and 747. In one embodiment, first contact region 745 of gate structure 713 is separated from intermediate contact region 749 by a first contact-free region in gate structure 713. In one embodiment, second contact region 747 of gate structure 713 is separated from intermediate contact region 749 by a second contact-free region in gate structure 713.

In the embodiment illustrated in FIG. 7, gate electrode 709 is coupled to gate structure 713 through contacts 733 and 735. Gate electrode 710 is coupled to gate structure 713 through contacts 737 and 739 in first contact region 745. Gate electrode 710 is coupled to gate structure 713 through contacts 755 and 757 in intermediate contact region 749. Gate electrode 710 is also coupled to gate structure 713 through contacts 741 and 743 in second contact region 747. In the embodiment illustrated in FIG. 7, there are no contacts between gate structure 713 and gate electrode 710 in the first contact-free region between first contact region 745 and intermediate contact region 749. In addition, there are no contacts between gate structure 713 and gate electrode 710 in the second contact-free region between intermediate contact region 749 and second contact region 747.

Operation of device 701 is similar to the operation of device 501 in accordance with the teachings of one embodiment of the present invention. In one embodiment, a gate signal is received by gate structure 713 from gate electrode 709 through contacts 733 and 735. Gate electrode 710 receives the gate signal through contacts 737 and 739 and provides the gate signal to gate structure 713 at other locations along source electrode finger 735 through contacts 741, 743, 755 and 757. As a result, the switching or turn-on and turn-off of device 701 is more uniform along the length of source electrode finger 725 in comparison with the turn on and turn off of prior art device 101.

However, due to the distributed resistance in gate structure 713 in the first contact-free region between the first contact region 745 and intermediate contact region 749, and due to the distributed resistance in gate structure 713 in the second contact-free region between intermediate contact region 749 and second contact region 747, there is an RC delay in the switching of device 701.

Figure 8:
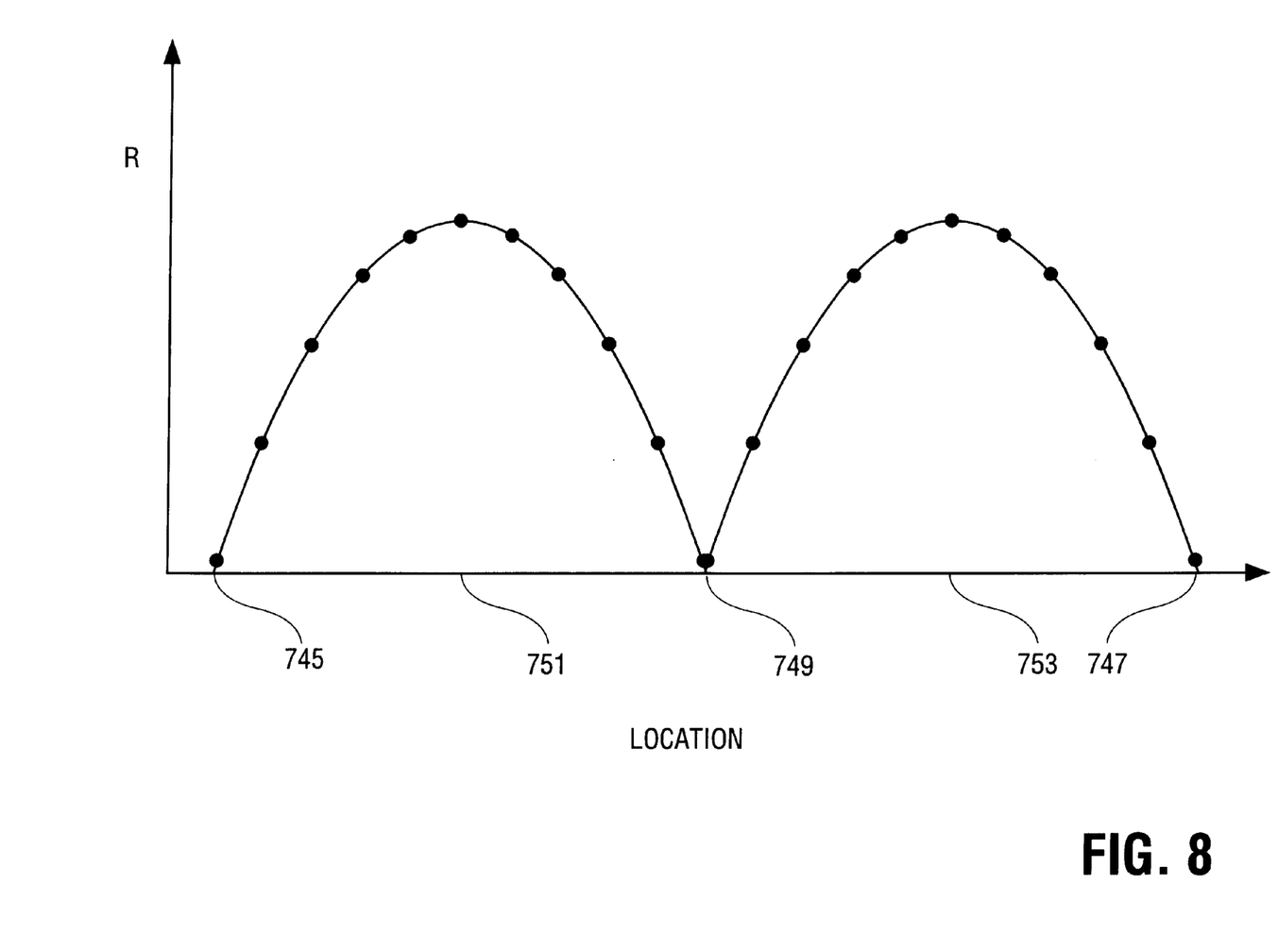
FIG. 8 is an illustration showing the resistance between the gate structure and gate electrode from various locations of the gate structure along the source finger of another embodiment of the present invention.

FIG. 8 is an illustration showing the resistance R to gate electrode 710 from various locations within gate structure 713. As shown in FIG. 8, the resistance R to gate electrode 710 from the location of first contact region 745 in gate structure 713 is substantially zero. This is because gate structure 713 is coupled to gate electrode 710 through contacts 737 and 739 at this location. Similarly, the resistance R between gate structure 713 and gate electrode 710 is also substantially zero at the locations of second contact region 747 and intermediate contact region 749.

In the locations of the first and second contact-free regions between first contact region 745, intermediate contact region 749 and second contact region 747, the resistance R between gate structure 713 and gate electrode 710 is substantially greater due to the sheet resistance of gate structure 713. As shown in FIG. 8, the resistance R is maximum at locations 751 and 753, which in one embodiment are midway between first contact region 745, intermediate contact region 749 and second contact region 747. It is appreciated that the effective resistances R between the gate electrode 710 and gate structure 713 in the contact-free regions are equivalent to two resistors coupled in parallel between gate structure 713 and gate electrode 710. The effective resistances R approach zero as the location in gate structure 713 approaches any one of the first, second or intermediate contact regions 745, 747 or 749.

Similar to device 501 discussed above, it is also noted that since gate electrode 710 is only coupled to gate structure 713 in first, second and intermediate contact regions 745, 747 and 749, the width W of the source electrode finger 725 is greater in comparison to the width W of the source electrode finger 325 of prior art device 301. Although contacts 755 and 757 limit the width of source electrode finger 725 near intermediate contact region 749, source electrode finger 725 maintains its width W between the intermediate contact region 749 and first contact region 745, which is where the current density is the highest. Therefore, source electrode finger 725 has a capacity to carry more current than source electrode finger 325 of device 301. Thus, the length L of device 701 can be increased to increase the length of the source and drain electrode fingers to increase the efficiency and active area to inactive area ratio of device 701.

Referring once again briefly back to FIG. 4, it is noted that one embodiment of device 701 also exhibits an SOA similar to plot 403. That is, device 701 has a larger SOA and a higher and more desirable maximum current of $I_{MAX1}$, even with drain and source fingers that are increased in length to increase the efficiency of device 701.

It is noted that for explanation purposes, device 501 has been described to include two contact regions 545 and 547 and that device 701 has been described to include three contact regions 745, 747 and 749. It is appreciated that other embodiments of the present invention may include other numbers of contact regions, and corresponding contact-free regions, in accordance with the teachings of the present invention. As the number of contact regions increases and the length of the contact-free regions decreases, the distributed resistance provided by the gate structure decreases. In addition, the maximum current provided by the MOSFET finger is also decreases as the number of contact regions increases due to limitations on the width W caused by the contact regions. The number of contact regions chosen in accordance with the teachings of the present invention may therefore be selected to achieve a desired resistance for the gate structure.

The foregoing description has provided numerous examples of the present invention. It will be appreciated that various modifications and changes may be made thereto without departing from the broader spirit and scope of the invention as set forth in the appended claims.

What is claimed is:

1. A field effect device, comprising:
   a source region, a drain region and a channel region located between the source region and the drain region;
   a gate structure disposed over the channel region, the gate structure having a first contact region and a second contact region separated by a contact-free region;
   a gate electrode coupled to the gate structure through first and second contacts, the first and second contacts coupled to the gate structure in the first and second contact regions, respectively;
   a source electrode coupled to the source region, wherein a width of the source electrode proximate to the contact-free region is greater than a width of the source electrode proximate to the first and second contact regions such that an overlap of the gate structure by the source electrode is greater in the contact-free region in comparison with the first and second contact regions; and
   a field plate including the gate structure disposed over the channel region and extending toward the drain region.

2. The field effect device described in claim 1 wherein the gate structure comprises a first end and a second end opposite the first end, wherein the first contact region is located at the first end and the second contact region is located at the second end.

3. The field effect device described in claim 1 wherein a resistance between the gate electrode and the first and second contact regions is substantially less than a resistance between the gate electrode and the contact-free region.

4. The field effect device described in claim 1 wherein a sheet resistance of the gate structure is substantially less than a sheet resistance of the gate electrode.

5. The field effect device described in claim 1 wherein the gate structure comprises at least one of polysilicon and silicide.

6. The field effect device described in claim 1 wherein a portion of the gate electrode is disposed over the gate structure and extends over an insulating layer towards a drain electrode coupled to the drain region.

7. The field effect device described in claim 1 wherein the field effect device comprises a lateral power metal-oxide-semiconductor field effect transistor (MOSFET).

8. The lateral power MOSFET described in claim 7 wherein the lateral power MOSFET has a breakdown voltage of greater than 200 volts.

9. The lateral power MOSFET described in claim 8 wherein the source region comprises source finger regions and the drain region comprises drain finger regions, wherein the source and drain finger regions are interdigitated.

10. The field effect device described in claim 1 wherein the field plate further comprises the gate electrode.

11. The lateral power MOSFET described in claim 7 further comprising an extended drain region located between the drain region and the channel region.

12. A field effect device, comprising:
    a source region, a drain region and a channel region located between the source region and the drain region;
    a gate structure disposed over the channel region, the gate structure having a first end region and a second end region opposite the first end region, the gate structure having a contact-free region between the first end region and the second end region;
    a gate electrode coupled to the gate structure through a first contact and a second contact, the first contact coupled to the gate structure in the first end region and the second contact coupled to the gate structure in the second end region;
    a source electrode coupled to the source region, wherein a width of the source electrode proximate to the contact-free region is greater than a width of the source electrode proximate to the first and second end regions such that an overlap of the gate structure by the source electrode is greater in the contact-free region in comparison with the first and second end regions; and
    a field plate including the gate structure disposed over the channel region and extending toward the drain region.

13. The field effect device described in claim 12 wherein a length of the contact-free region is substantially greater than a length of the first end region.

14. The field effect device described in claim 12 wherein a length of the contact-free region is substantially greater than a length of the second end region.

15. The field effect device described in claim 12 wherein the gate structure comprises any one of polysilicon and silicide.

16. The field effect device described in claim 12 wherein a portion of the gate electrode is disposed over the gate structure and extends over an insulating layer towards a drain electrode coupled to the drain region.

17. The field effect device described in claim 12 wherein the gate structure has a sheet resistance substantially greater than a sheet resistance of the gate electrode.

18. The field effect device described in claim 12 wherein a resistance from a first end region to the gate electrode is substantially less than a resistance from the contact-free region to the gate electrode.

19. The field effect device described in claim 18 wherein there is substantially no resistance from the first end region to the gate electrode.

20. The field effect device described in claim 19 wherein a resistance from the second end region to the gate electrode is substantially equal to the resistance from the first end region to the gate electrode.

21. The field effect device described in claim 12 wherein the field effect device is a lateral power metal-oxide-semiconductor field effect transistor (MOSFET).

22. The lateral power MOSFET described in claim 21 the lateral power MOSFET has a breakdown voltage of greater than 200 volts.

23. The lateral power MOSFET described in claim 22 wherein the source region comprises source finger regions and the drain region comprises drain finger regions, wherein the source and drain finger regions are interdigitated.

24. The field effect device described in claim 12 wherein the field plate further comprises the gate electrode.

25. The lateral power MOSFET described in claim 21 further comprising an extended drain region located between the drain region and the channel region.

26. A field effect device, comprising:
a source region, a drain region and a channel region located between the source region and the drain region;
a gate structure disposed over the channel region, the gate structure having a first end region, a center region and a second end region, the gate structure further having a first contact-free region between the first end region and the center region, the gate structure further having a second contact-free region between the center region and the second end region;
a gate electrode coupled to the gate structure through a first contact, a second contact and a center contact, the first contact coupled to the gate structure in the first end region, the center contact coupled to the gate structure in the center region and the second contact coupled to the gate structure in the second end region; and
a source electrode coupled to the source region, wherein a width of the source electrode proximate to the first and second contact-free regions is greater than a width of the source electrode proximate to the first, center and second end regions such that an overlap of the gate structure by the source electrode is greater in the first and second contact-free region in comparison with the first, center and second end regions.

27. The field effect device described in claim 26 wherein a resistance between the gate electrode and the first end, center and second end regions are less than a resistance between the gate electrode and the first and second contact-free regions.

28. The field effect device described in claim 26 wherein a sheet resistance of the gate structure is substantially greater than a sheet resistance of the gate electrode.

29. The field effect device described in claim 26 wherein the gate structure comprises any one of polysilicon and silicide.

30. The field effect device described in claim 26 wherein a portion the gate electrode is disposed over the gate structure.

31. A field effect device, comprising:
a source region, a drain region and a channel region located between the source region and drain region;
a gate structure disposed over the channel region, the gate structure having a first region and a second region separated by an intermediate region;
a gate electrode coupled to the gate structure through first and second contacts, the first and second contacts coupled to the gate structure in the first and second regions, respectively, such that a resistance from the gate electrode to the intermediate region is substantially greater than a resistance from the gate electrode to the first and second regions due to a sheet resistance of the gate structure; and
a source electrode coupled to the source region, wherein a width of the source electrode proximate to the intermediate region is greater than a width of the source electrode proximate to the first and second regions such that an overlap of the gate structure by the source electrode is greater in the intermediate region in comparison with the first and second regions; and
a field plate including the gate structure disposed over the channel region and extending toward the drain region.

32. The field effect device described in claim 31 wherein the sheet resistance of the gate structure is greater than a sheet resistance of the gate electrode.

33. The field effect device described in claim 31 wherein the intermediate region is free of contacts to the gate electrode.

34. The field effect device described in claim 31 wherein the gate electrode is coupled to receive a control signal to switch the field effect device.

35. The field effect device described in claim 34 further comprising a drain electrode such that a current is configured to flow between the source electrode and the drain electrode in response to the control signal.

36. The field effect device described in claim 31 wherein the field effect device is a lateral power metal-oxide-semiconductor field effect transistor (MOSFET).

37. The lateral power MOSFET described in claim 36 wherein the lateral power MOSFET has a breakdown voltage of greater than 200 volts.

38. The lateral power MOSFET described in claim 37 wherein the source region comprises source finger regions and the drain region comprises drain finger regions, wherein the source and drain finger regions are interdigitated.

39. The field effect device described in claim 31 wherein the field plate further comprises the gate electrode.

40. The lateral power MOSFET described in claim 36 further comprising an extended drain region located between the drain region and the channel region.

41. The field effect device described in claim 35 wherein a portion of the gate electrode is disposed over the gate structure and extends over an insulating layer towards the drain electrode.

42. A field effect device, comprising:
a source region, a drain region and a channel region located between the source region and the drain region;
a gate structure disposed over the channel region, the gate structure having a first contact region and a second contact region separated by a contact-free region;
a source electrode coupled to the source region through an insulating layer, wherein a width of the source electrode proximate to the contact-free region is greater than a width of the source electrode proximate to the first and second contact regions such that an overlap of the gate structure by the source electrode is greater in the contact-free region in comparison with the first and second contact regions;
a drain electrode coupled to the drain region through the insulating layer; and
a gate electrode coupled to the gate structure through the insulating layer through first and second contacts, the first and second contacts coupled to the gate structure in the first and second contact regions, respectively, the gate electrode disposed over the insulating layer over the gate structure.

43. The field effect device described in claim 42 wherein the gate structure comprises a first end and a second end opposite the first end, wherein the first contact region is located at the first end and the second contact region is located at the second end.

44. The field effect device described in claim 42 wherein a resistance between the gate electrode and the first and second contact regions is substantially less than a resistance between the gate electrode and the contact-free region.

45. The field effect device described in claim 42 wherein a sheet resistance of the gate structure is substantially less than a sheet resistance of the gate electrode.

46. The field effect device described in claim 42 wherein the gate structure comprises at least one of polysilicon and silicide.

47. The field effect device described in claim 42 wherein the gate electrode comprises metal.

48. The field effect device described in claim 42 wherein the field effect device comprises a lateral power metal-oxide-semiconductor field effect transistor (MOSFET).

49. The lateral power MOSFET described in claim 48 wherein the lateral power MOSFET has a breakdown voltage of greater than 200 volts.

50. The lateral power MOSFET described in claim 49 wherein the source region comprises source finger regions and the drain region comprises drain finger regions, wherein the source and drain finger regions are interdigitated.

51. The field effect device described in claim 42 wherein the gate electrode extends over the insulating layer toward the drain electrode and away from the source electrode.

52. The lateral power MOSFET described in claim 48 further comprising an extended drain region located between the drain region and the channel region.

53. The field effect device described in claim 42 further comprising a field plate including at least a portion of the gate electrode disposed between the drain electrode and the gate structure.

54. The field effect device described in claim 42 further comprising a field plate including the gate structure disposed over the channel region and extending toward the drain region.

* * * * *